United States Patent
Umeki et al.

(10) Patent No.: US 8,909,490 B2
(45) Date of Patent: Dec. 9, 2014

(54) BATTERY STATE ESTIMATION DEVICE AND BATTERY STATE ESTIMATION METHOD

(75) Inventors: Shiho Umeki, Kawaguchi (JP); Hisafumi Asai, Atsugi (JP); Hideo Nakamura, Yokohama (JP); Kazuhiko Tazoe, Fujisawa (JP); Satoshi Segawa, Atsugi (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 446 days.

(21) Appl. No.: 13/393,507

(22) PCT Filed: Feb. 18, 2011

(86) PCT No.: PCT/JP2011/053534
§ 371 (c)(1),
(2), (4) Date: Apr. 30, 2012

(87) PCT Pub. No.: WO2011/102472
PCT Pub. Date: Aug. 25, 2011

(65) Prior Publication Data
US 2012/0316812 A1 Dec. 13, 2012

(30) Foreign Application Priority Data
Feb. 18, 2010 (JP) ............... P2010-033903
Feb. 9, 2011 (JP) ............... P2011-026032

(51) Int. Cl.
G01R 31/36 (2006.01)
H01M 10/48 (2006.01)
G06F 11/00 (2006.01)
H01M 10/052 (2010.01)

(52) U.S. Cl.
CPC ......... *H01M 10/482* (2013.01); *G01R 31/3624* (2013.01); *H01M 10/052* (2013.01); *G01R 31/3651* (2013.01)
USPC ................ 702/63; 702/64; 702/65; 702/188

(58) Field of Classification Search
CPC .......... G01R 31/3658; G01R 31/3693; G01R 31/3655
USPC ....................... 702/63–65, 182–190
See application file for complete search history.

(56) References Cited

U.S. PATENT DOCUMENTS

| | | | |
|---|---|---|---|
| 7,521,895 B2 | 4/2009 | Plett | |
| 7,583,059 B2 | 9/2009 | Cho | |
| 8,103,485 B2* | 1/2012 | Plett | ................ 703/2 |
| 2004/0100227 A1* | 5/2004 | Yumoto et al. | ........... 320/151 |
| 2004/0169495 A1 | 9/2004 | Yumoto et al. | |
| 2009/0109046 A1 | 4/2009 | Gielniak | |

FOREIGN PATENT DOCUMENTS

| | | |
|---|---|---|
| CN | 1503399 A | 6/2004 |
| CN | 1525592 A | 9/2004 |

(Continued)

OTHER PUBLICATIONS

Chinese Office Action dated Oct. 10, 2013, (4 pgs.).

*Primary Examiner* — Phuong Huynh
(74) *Attorney, Agent, or Firm* — Foley & Lardner LLP

(57) ABSTRACT

An object of the present invention is to provide a battery state estimation device and a battery state estimation method which identify parameter of a secondary battery with high accuracy. A current and a terminal voltage of secondary battery are detected, then by using the current measured value and terminal voltage measured value thus detected, the terminal voltage of secondary battery based on predetermined battery model is estimated, and the parameter of the secondary battery is identified such that a difference between terminal voltage measured value and voltage estimated value is converged to zero. In the identifying of parameter of secondary battery, the terminal voltage measured value and terminal voltage estimated value are subjected to filter treatment by low pass filter having a common high frequency breaking characteristic and the terminal voltage measured value and terminal voltage estimated value subjected to the filter treatment are used.

10 Claims, 13 Drawing Sheets

(56) References Cited

FOREIGN PATENT DOCUMENTS

| EP | 1 422 804 B1 | 9/2007 |
|---|---|---|
| JP | 05-142313 A | 6/1993 |
| JP | 2003-185719 A | 7/2003 |
| RU | 2131158 C1 | 5/1999 |
| RU | 2283504 C1 | 9/2006 |
| RU | 2328753 C2 | 7/2008 |
| RU | 2361333 C2 | 7/2009 |

* cited by examiner

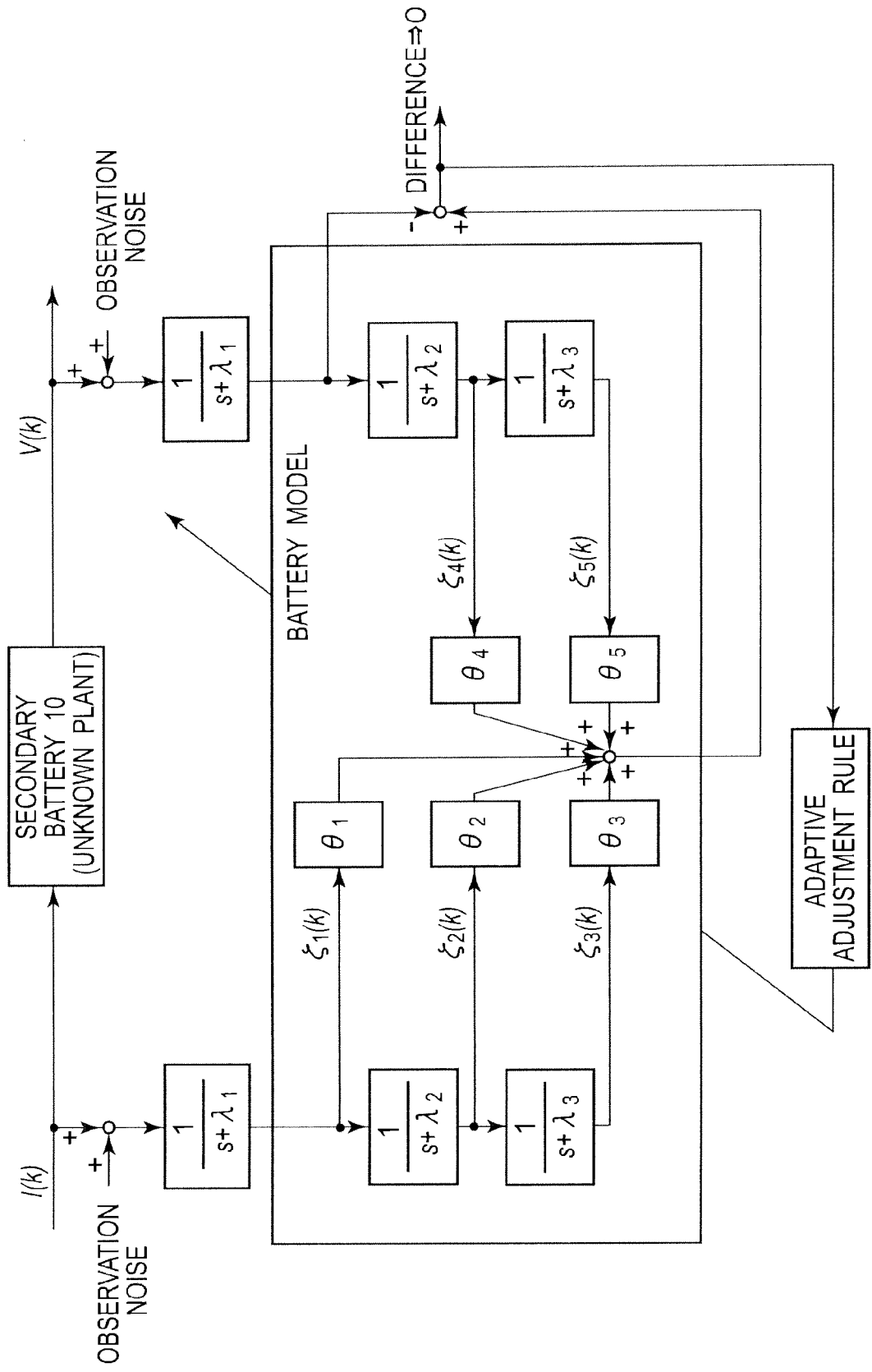

BATTERY STATE ESTIMATION DEVICE AND BATTERY STATE ESTIMATION METHOD

TECHNICAL FIELD

The present invention relates to a battery state estimation device and a battery state estimation method.

BACKGROUND ART

Japanese Patent Unexamined Publication No. 2003-185719 discloses a control device of a secondary battery as set forth below. That is, the control device of the secondary battery defines a predetermined battery model, and a current measured value and a terminal voltage measured value of the secondary battery are converted into a state quantity by using a state variable filter which is based on a battery model. By using the state quantity, the control device of the secondary battery estimates the secondary battery's terminal voltage which is based on the battery model. Then, the control device of the secondary battery identifies a parameter of the secondary battery such that a difference between the voltage measured value and the terminal voltage estimated based on the battery model is converged to zero.

SUMMARY OF INVENTION

In the Japanese Patent Unexamined Publication No. 2003-185719, however, a part of the current measured value and terminal voltage measured value of the secondary battery is used for estimating the terminal voltage without being subjected to a filter treatment by a state variable filter. Herein, the current measured value and terminal voltage measured value of the secondary battery are those measured by an ammeter or a voltmeter, therefore, ordinarily include an observation noise. Therefore, the Japanese Patent Unexamined Publication No. 2003-185719 has such a problem that an influence by the observation noise causes an insufficient accuracy of identifying the parameter of the secondary battery.

It is an object of the present invention to provide a battery state estimation device and a battery state estimation method which are capable of identifying the parameter of the secondary battery with a high accuracy.

For solving the above problem, an aspect of the present invention includes a battery state estimation device and a battery state estimation method, where a current of a secondary battery and a terminal voltage of the secondary battery are detected, then by using the current measured value and terminal voltage measured value thus detected, the terminal voltage of the secondary battery which terminal voltage is based on a predetermined battery model is estimated, and then a parameter of the secondary battery is identified such that a difference between the terminal voltage measured value and the voltage estimated value is converged to zero. In the identifying of the parameter of the secondary battery, the terminal voltage measured value and the terminal voltage estimated value are subjected to a filter treatment by a low pass filter having a common high frequency breaking characteristic, and the terminal voltage measured value and the terminal voltage estimated value which are subjected to the filter treatment are used.

Advantageous Effects of Invention

According to the aspect of the present invention, in the identifying of the parameter of the secondary battery, the terminal voltage measured value and the terminal voltage estimated value are subjected to a filter treatment by a low pass filter having a common high frequency breaking characteristic, and the terminal voltage measured value and the terminal voltage estimated value which are subjected to the filter treatment are used. By this operation, the influence of the observation noise included in the current measured value and terminal voltage measured value can be effectively removed, as a result, making it possible to identify a parameter of the secondary battery with a high accuracy.

BRIEF DESCRIPTION OF DRAWINGS

FIG. 14 is another example of the block diagram of the adaptive identification system, according to the third embodiment.

DESCRIPTION OF EMBODIMENTS

Hereinafter, the embodiments of the present invention will be set forth based on the drawings.

First Embodiment

Figure 1:
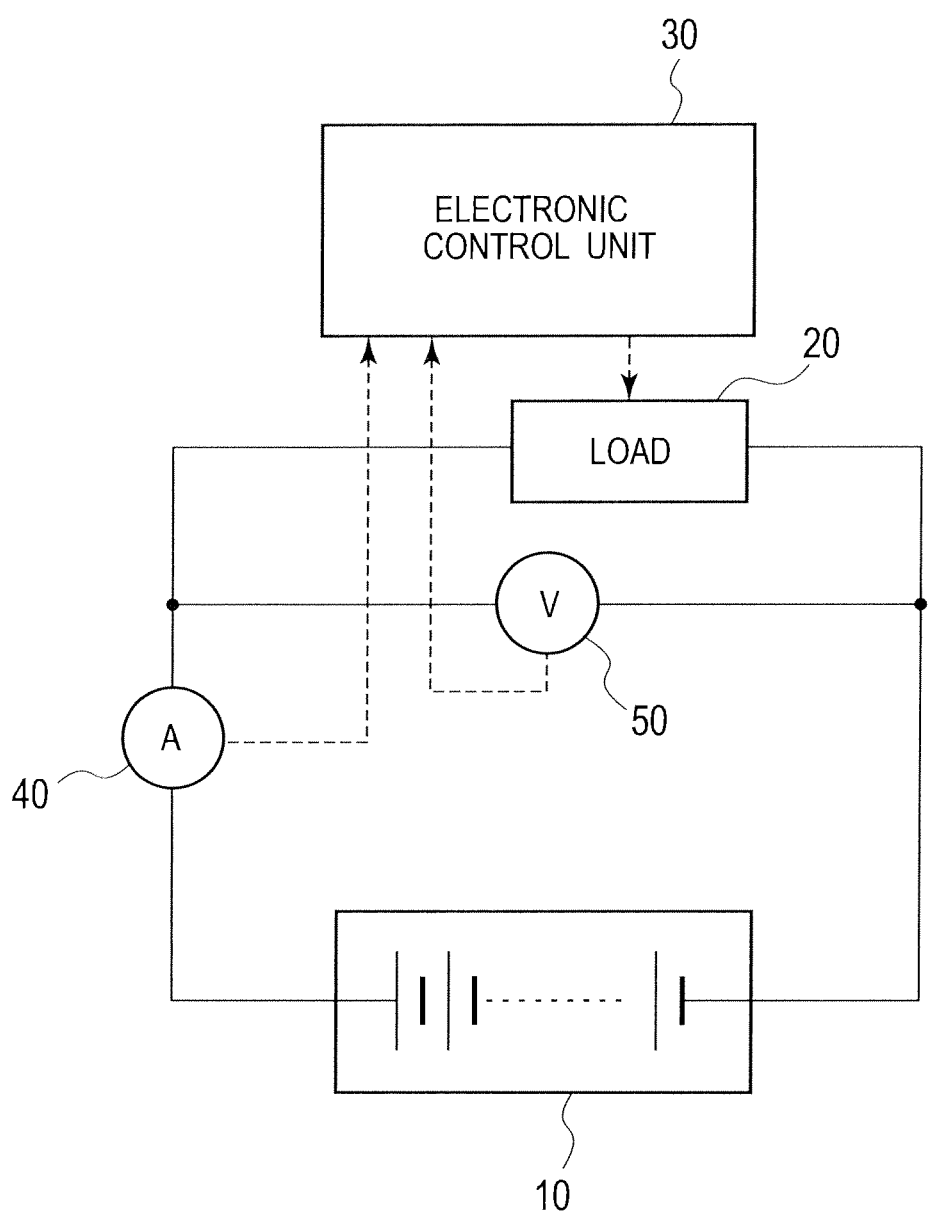
FIG. 1 is a diagram showing the structure of a control system of a secondary battery according to a first embodiment.

A control system shown in FIG. 1 is an example where a control device of a secondary battery according to the present invention is applied to a system which drives a load such as motor by a secondary battery or which charges the secondary battery by an electric power caused by a motor's regeneration or by an electric power generated by an alternator with an engine as a power source.

The secondary battery 10 has such a structure that a plurality of unit cells are connected in series. As the unit cell included in the secondary battery 10, for example, a lithium-series secondary battery such as lithium ion secondary battery is raised. As a load 20, for example, a motor and the like are raised.

A current sensor 40 is a sensor for detecting a charge-discharge current flowing through the secondary battery 10. A signal detected by the current sensor 40 is sent out to an electronic control unit 30. A voltage sensor 50 is a sensor for detecting a terminal voltage of the secondary battery 10. A signal detected by the voltage sensor 50 is sent out to the electronic control unit 30.

The electronic control unit 30 is a control unit for controlling the secondary battery 10 and includes a microcomputer which includes a CPU for operating a program, a ROM and a RAM which memorize the program or operation results, an electronic circuit, and the like.

Figure 2:
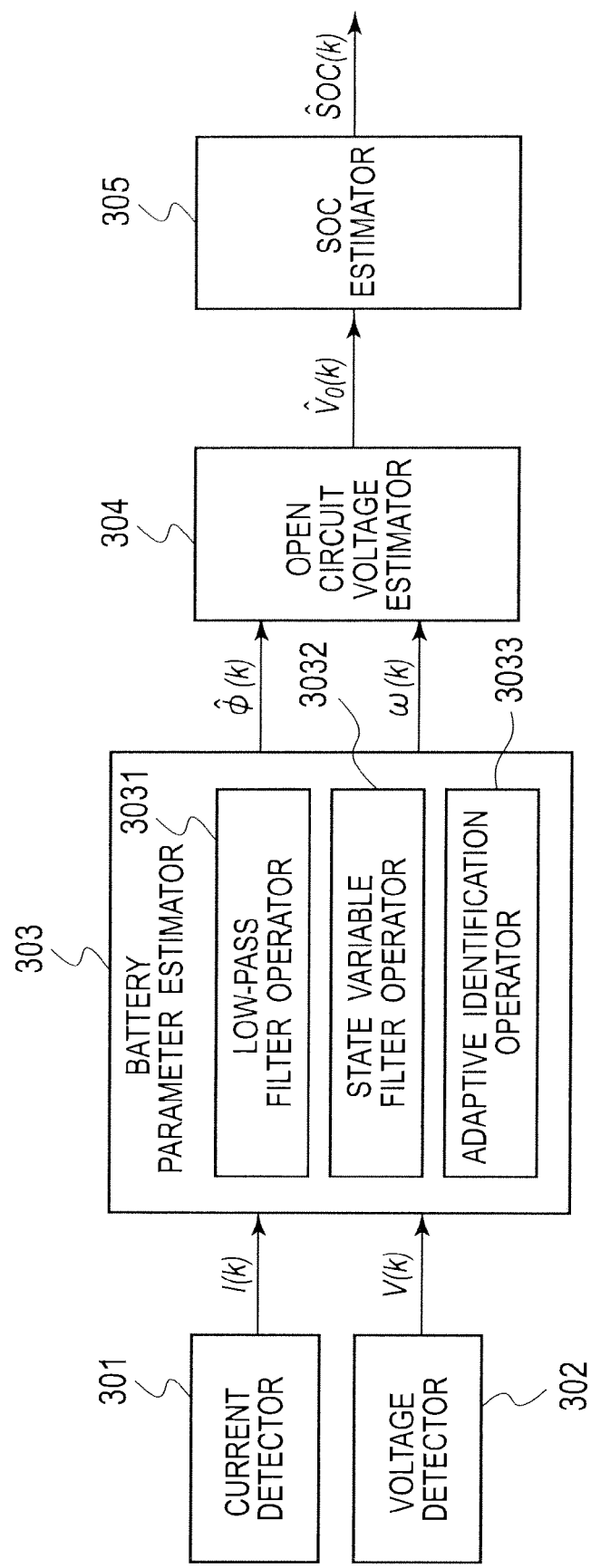
FIG. 2 is a functional block diagram of an electronic control unit 30 according to the first embodiment.

As shown in FIG. 2, the electronic control unit 30 includes a current detector 301, a voltage detector 302, a battery parameter estimator 303, an open circuit voltage estimator 304 and an SOC estimator 305. The battery parameter estimator 303 includes a low pass filter operator 3031, a state variable filter operator 3032, and an adaptive identification operator 3033.

The current detector 301 obtains a signal from an ammeter 40 at a predetermined period and then, based on the signal from the ammeter 40, detects the charge-discharge current flowing through the secondary battery 10, to thereby obtain a current measured value I(k). The current detector 301 sends out the thus obtained current measured value I(k) to the battery parameter estimator 303.

The voltage detector 302 obtains a signal from a voltmeter 50 at a predetermined period and then, based on the signal from the voltmeter 50, detects the terminal voltage of the secondary battery 10, to thereby obtain a voltage measured value V(k). The voltage detector 302 sends out the thus obtained voltage measured value V(k) to the battery parameter estimator 303.

The battery parameter estimator 303 defines a battery model of the secondary battery 10, and then, from the current measured value I(k) detected by the current detector 301 and the voltage measured value V(k) detected by the voltage detector 302, collectively estimates a battery parameter $\hat{\phi}(k)$ of the battery model of the secondary battery 10 through an adaptive digital filter operation.

Herein, the "^" added to a right shoulder of "φ" of the $\hat{\phi}(k)$ denotes an estimated value. In FIG. 2, "^" as an estimated value is respectively disposed right above "φ" of φ(k), right above "V" of $V_0(k)$, and right above "S" of SOC(k). As shown by the following expression (1), however, these are respectively equivalent to $\hat{\phi}(k)$, $\hat{V}_0(k)$ and $\hat{SOC}(k)$. Hereinafter, the same is true of $\hat{V}(k)$.

[Expression 1]

$$\left.\begin{array}{l}\phi^{\wedge}(k)=\hat{\phi}(k)\\ V_0^{\wedge}(k)=\hat{V}_0(k)\\ SOC^{\wedge}(k)=\hat{SOC}(k)\end{array}\right\} \quad (1)$$

Hereinafter, a method of estimating the battery parameter $\hat{\phi}(k)$ of the secondary battery 10 by the battery parameter estimator 303 will be set forth.

Figure 3:
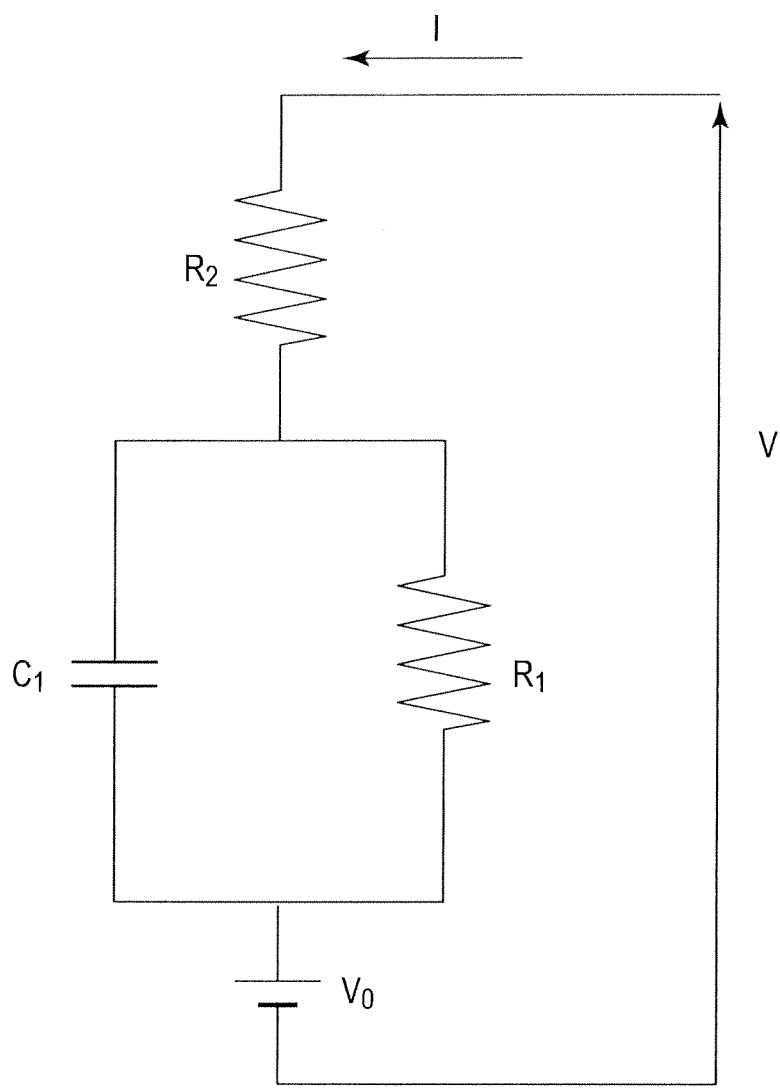
FIG. 3 is a diagram showing an equivalent circuit model which shows a battery model of the secondary battery.

First, "battery model" used according to this embodiment will be set forth. FIG. 3 is an equivalent circuit model of the battery model of the secondary battery 10 and the equivalent circuit model shown in FIG. 3 is given by the following expression (2).

[Expression 2]

$$V(t)=\frac{C_1\cdot R_1\cdot R_2\cdot s+R_1+R_2}{C_1\cdot R_1\cdot s+1}\cdot I(t)+V_0(t) \quad (2)$$

Herein, a model input is a current I [A] (a positive value denotes charge while a negative value denotes discharge), a model output denotes a terminal voltage V [V], $R_1$ [Ω] denotes a charge transfer resistance, $R_2$ [Ω] denotes a pure resistance, $C_1$ [F] denotes an electric double layer capacity, and $V_0$ [V] denotes an open circuit voltage. In the expression (2), s denotes a differential operator. The battery model according to this embodiment is a reduction model (primary—first order) which does not specifically separate a positive electrode from a negative electrode, however, can relatively accurately show the charge-discharge characteristic of an actual battery. As stated above according to this embodiment, the structure will be set forth with an order of the battery model set to primary (first order) as an example.

Then, expressing $R_1$, $R_2$, $C_1$ by the following expression (3) allows the above expression (2) to be given by the following expression (4).

[Expression 3]

$$K=R_1+R_2, \quad (3)$$
$$T_1=C_1\cdot R_1,$$
$$T_2=\frac{C_1\cdot R_1\cdot R_2}{R_1+R_2}$$

[Expression 4]

$$V(t)=\frac{K\cdot(T_2\cdot s+1)}{T_1\cdot s+1}\cdot I(t)+V_0(t) \quad (4)$$

According to this embodiment, from the battery model shown in the above expression (4), the battery parameter estimator 303 estimates the battery parameter $\hat{\phi}(k)$ of the battery model shown in FIG. 3 through the adaptive digital filter. Hereinafter, an explanation will be made about the method of estimating the battery parameter $\hat{\phi}(k)$ by the battery parameter estimator 303.

First, it is conceived that an open circuit voltage $V_0(t)$ is obtained by integrating, from an initial state, a current I(t) multiplied by a variable parameter h. In this case, the open circuit voltage $V_0(t)$ can be given by the following expression (5).

[Expression 5]

$$V_0(t)=\frac{h}{s}\cdot I(t) \quad (5)$$

Then, substituting the above expression (5) into the above expression (4) gives the following expression (6) to be led to the following expression (7) after an arrangement.

[Expression 6]

$$V(t) = \frac{K \cdot (T_2 \cdot s + 1)}{T_1 \cdot s + 1} \cdot I(t) + \frac{h}{s} \cdot I(t) \quad (6)$$

[Expression 7]

$$V(t) = \frac{K \cdot T_2 \cdot s^2 + (K + T_1 \cdot h) \cdot s + h}{T_1 \cdot s^2 + s} \cdot I(t) \quad (7)$$

The above expression (2) and above expression (7) respectively correspond to the following expression (8) and following expression (9), and correspond to those where the order of each of A(s) and B(s) is set to primary (first order) in the following expression (8) and following expression (9).

[Expression 8]

$$V(t) = \frac{B(s)}{A(s)} \cdot I(t) + V_0(t) \quad (8)$$

[Expression 9]

$$V(t) = \frac{s \cdot B(s) + A(s) \cdot h}{s \cdot A(s)} \cdot I(t) \quad (9)$$

Herein, A(s) and B(s) are each a polynomial function of s, where the A(s) and B(s) have the same order.

Then, introducing a known constant $k_i$ (i=1, 2, n) to the above expression (7) can give the following expression (10) and expression (11).

[Expression 10]

$$\left. \begin{array}{l} f_{Vi}(t) = \dfrac{s^{2-i}}{s^2 + k_1 \cdot s + k_2} \cdot V(t) \\ f_{Ii}(t) = \dfrac{s^{2-i}}{s^2 + k_1 \cdot s + k_2} \cdot I(t) \end{array} \right\} \quad (10)$$

[Expression 11]

$$y(t) = \sum_{i=1}^{2} \{I_i f_{Vi}(t) + b_{0i} f_{Ii}(t)\} = [\, I_i \quad b_{0i} \,] \cdot \begin{bmatrix} f_{Vi} \\ f_{Ii} \end{bmatrix} \quad (11)$$

In the above expression (11), $I_i$ and $b_{0i}$ are each a parameter including an unknown parameter ($T_1$, $T_2$, K, h). $f_{vi}$ and $f_{Ii}$ are each a conversion state quantity obtained by subjecting the values I(k), V(k) which are respectively measurable by the ammeter 40 and voltmeter 50 to a filter treatment by a state variable filter. Since the above expression (11) is a product sum of these, the above expression (11) coincides with the following expression (12) which is a standard form of the adaptive digital filter.

[Expression 12]

$$y(t) = \phi^T \omega \quad (12)$$

In the above expression (12), $\phi^T = [I_i, b_{0i}]$, $\omega = [f_{vi}, f_{Ii}]$.

Then, based on an algorithm shown in the following expression (13), an identification of the battery parameter $\hat{\phi}(k)$ of the battery model is implemented from a conversion state quantity ω(k) pursuant to an adaptive adjustment rule such that a difference between a voltage estimated value V^(k) which is a terminal voltage estimated value of the secondary battery 10 estimated by the above battery model and the voltage measured value V(k) which is an actual measured value detected by the voltmeter 50 and obtained by the voltage detector 302 can be converged to zero. In this case, according to this embodiment, "both limits trace gain method" where a logical defect of a simple "adaptive digital filter by least square approach" has been improved can be used. Herein, the logical defect signifies that once the estimated value is converged, an accurate estimation cannot be accomplished again even when the parameter changes afterward.

[Expression 13]

$$\left. \begin{array}{l} \hat{\phi}(k) = \hat{\phi}(k-1) - \gamma(k) \cdot \Gamma(k-1) \cdot \zeta(k) \cdot e(k) \\ e(k) = \hat{V}(k) - V(k) \\ \hat{V}(k) = \zeta^T(k) \cdot \hat{\phi}(k-1) \end{array} \right\} \quad (13)$$

The above expression (13) includes sequential expressions for adaptively calculating the battery parameter $\hat{\phi}(k)$. γ(k) and Γ(k−1) are each an adaptive gain, of these, γ(k) is a scalar gain (error gain) while Γ(k−1) is a line gain (signal gain). Then, when a state quantity ζ(k) at a time point k is obtained by the above expression (13), it is possible to calculate e(k) which is a difference between the voltage estimated value V^(k) which is the terminal voltage estimated value of the secondary battery 10 estimated from the battery model and the voltage measured value V(k) detected by the voltmeter 50 and obtained by the voltage detector 302. Converging this e(k) to zero can sequentially calculate the battery parameter $\hat{\phi}(k)$.

Herein, according to this embodiment, as shown in FIG. 2, the battery parameter estimator 303 has the low pass filter operator 3031, the state variable filter operator 3032 and the adaptive identification operator 3033. Then, according to this embodiment, the low pass filter operator 3031, the state variable filter operator 3032 and the adaptive identification operator 3033 calculate the battery parameter $\hat{\phi}(k)$ by the method to be set forth below. Hereinafter, the method of calculating the battery parameter $\hat{\phi}(k)$ according to this embodiment will be set forth referring to a block diagram of an adaptive identification system shown in FIG. 4.

Figure 4:
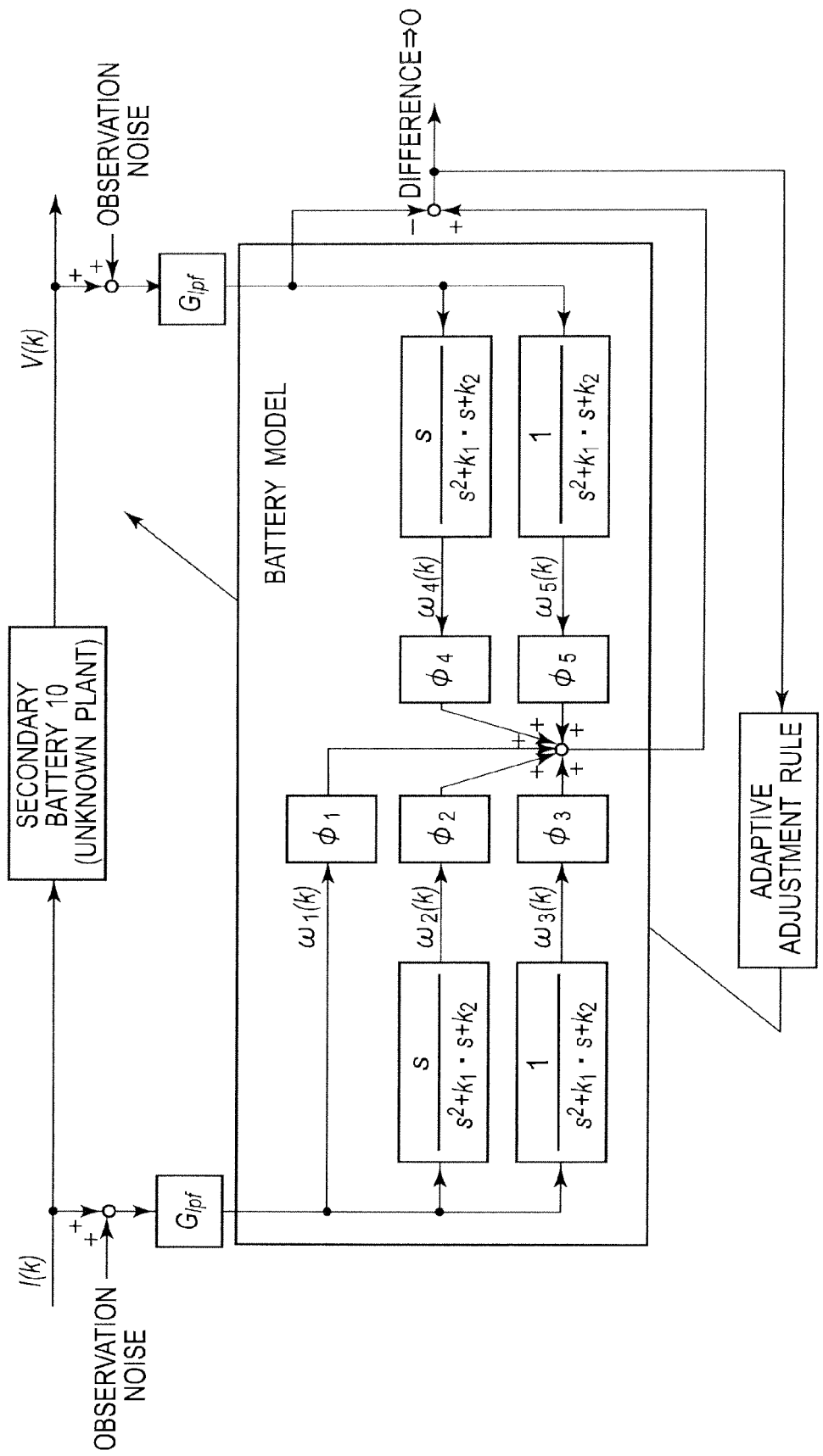
FIG. 4 is a block diagram of an adaptive identification system according to the first embodiment.

That is, according to this embodiment, for calculating the battery parameter $\hat{\phi}(k)$ according to the above method, the low pass filter operator 3031 implements the filter treatment by a low pass filter $G_{lpf}$, as shown in FIG. 4. By this operation, the low pass filter operator 3031 can remove the observation noise with respect to the current measured value I(k) detected by the current detector 301 and the voltage measured value V(k) detected by the voltage detector 302.

Then, by using the current measured value I(k) and voltage measured value V(k) from which the observation noise was removed by the low pass filter $G_{lpf}$, the state variable filter operator 3032 obtains the conversion state quantity ω(k) (conversion state quantities $\omega_1(k)$, $\omega_2(k)$, $\omega_3(k)$, $\omega_4(k)$, $\omega_5(k)$), using the state variable filter, as shown in FIG. 4. That is, according to this embodiment, in the above expressions (10) and (11), as I(t) and V(t), those subjected to the filter treatment which uses the low pass filter $G_{lpf}$ and is implemented by the low pass filter operator 3031 to thereby remove the observation noise are used. Then, based on the conversion state quantity ω(k), the state variable filter operator 3032 calculates the voltage estimated value V^(k) which is the terminal voltage estimated value based on the battery model.

Then, as shown in FIG. 4, by using the conversion state quantity ω(k) obtained by the state variable filter operator 3032 as well as the current measured value I(k) and voltage measured value V(k) from which the observation noise was removed by the low pass filter $G_{lpf}$, the adaptive identification operator 3033 implements an identification of the battery parameter φ^(k) (φ$_1$, φ$_2$, φ$_3$, φ$_4$, φ$_5$) of the battery model. That is, according to this embodiment, in the above expression (13), as V(k) and V^(k), those subjected to the filter treatment which uses the low pass filter $G_{lpf}$ and is implemented by the low pass filter operator 3031 to thereby remove the observation noise are used.

In this way, the current measured value I(k) and voltage measured value V(k) are subjected to the filter treatment which uses the low pass filter $G_{lpf}$ to thereby remove the observation noise. By this operation, in the identification of the battery parameter φ^(k) by converging to zero the difference e(k) between the voltage estimated value V^(k) and the voltage measured value V(k), an influence by the observation noise can be effectively removed. As a result, the estimation accuracy of the battery parameter φ^(k) can be improved.

Herein, the low pass filter $G_{lpf}$ used according to this embodiment is not specifically limited, however, the one given by the following expression (14) may be raised.

[Expression 14]

$$G_{lpf} = \frac{s^{n-1}}{s^n + k_{n-1} \cdot s^{n-1} + \ldots + k_1 \cdot s + k_0} \quad (14)$$

Figure 5:
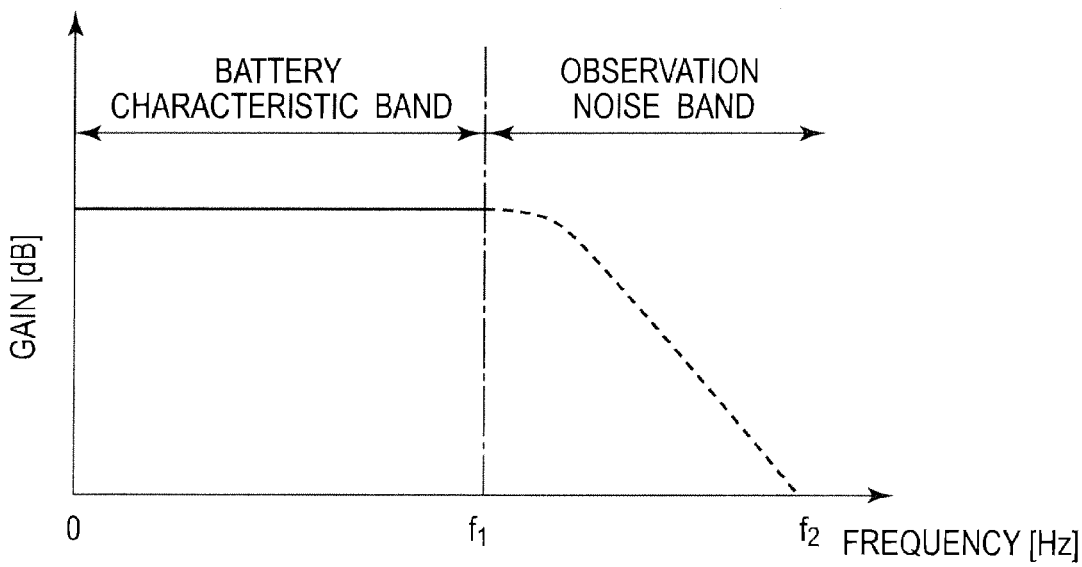
FIG. 5 is a drawing showing frequency band characteristics of a current measured value I(k), a voltage measured value V(k) and a voltage estimated value V^(k).

Herein, as shown in FIG. 5, the current measured value I(k) and voltage measured value V(k) each includes a frequency band which is necessary for obtaining the battery characteristic, for example, a battery characteristic band (0 Hz to f$_1$ Hz) shown in FIG. 5 and a frequency band based on the observation noise, for example, an observation noise band (f$_1$ Hz to f$_2$ Hz) in the example shown in FIG. 5. The frequency band based on the observation noise is considered to be on a frequency side higher than the frequency band necessary for obtaining the battery characteristic. In addition, FIG. 5 shows the frequency band characteristic of the current measured value I(k) and voltage measured value V(k). Herein, the frequency band of the battery characteristic can be measured, for example, by cole-cole plot and the like. In addition, the frequency band based on the observation noise can be measured by FFT (fast Fourier transformation) and the like.

Figure 6:
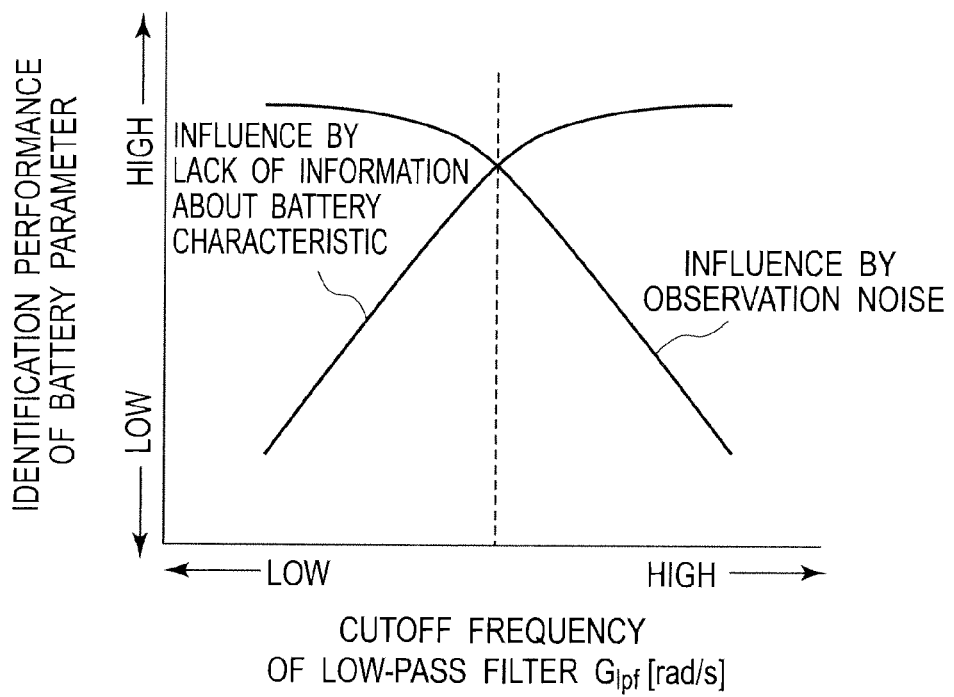
FIG. 6 is a relative drawing showing a relation between a cutoff frequency of a low pass filter $G_{lpf}$ and an influence which may be caused to an identification performance of a battery parameter by lack of information necessary for obtaining a battery characteristic and by an observation noise.
Figure 7:
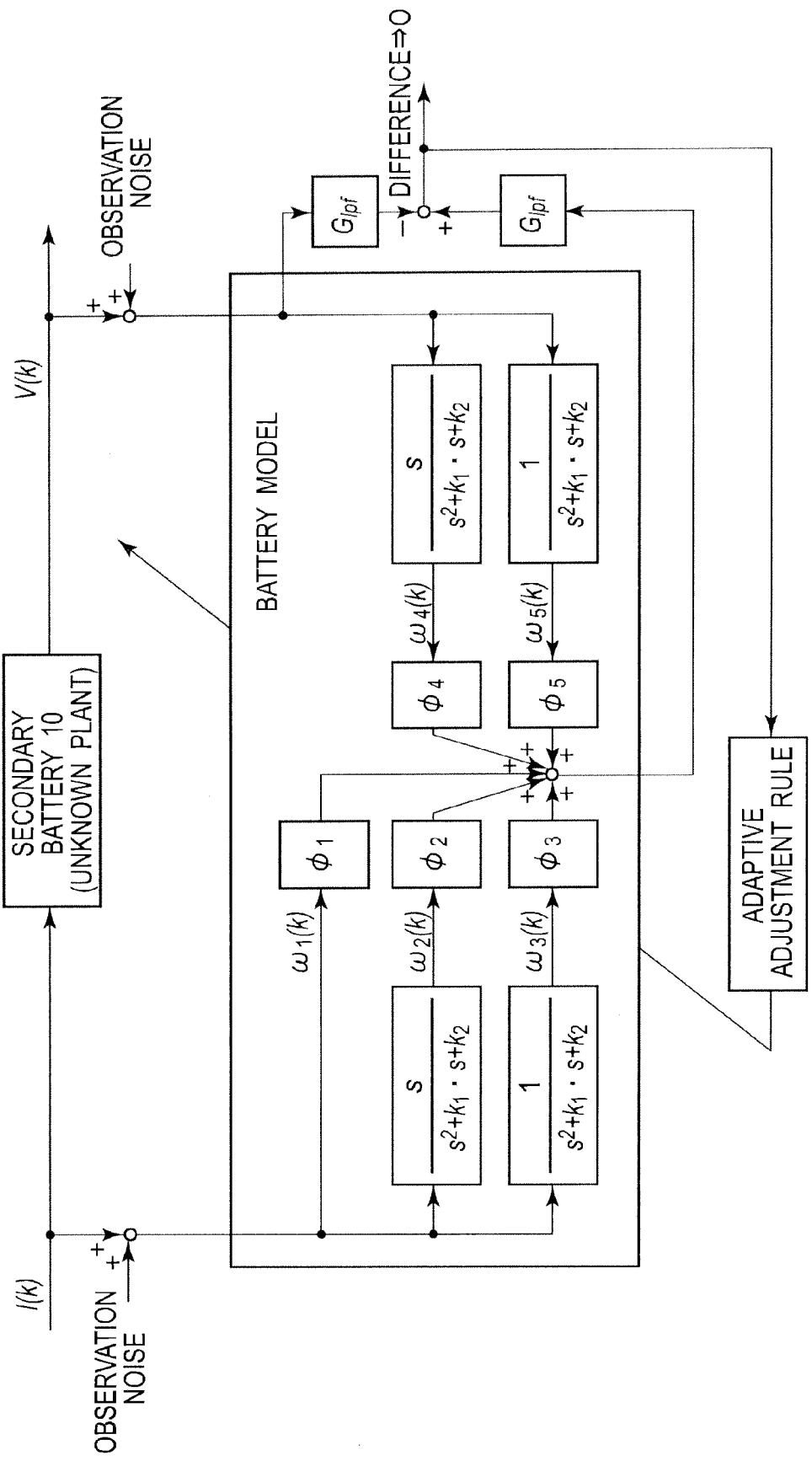
FIG. 7 is a block diagram of an adaptive identification system which is an equivalent transformation of FIG. 4.

Then, as shown in FIG. 6, an influence by the lack of information necessary for obtaining the battery characteristic and an influence by the observation noise are in a trade-off relationship with each other, with respect an identification performance of the battery parameter relative to a cutoff frequency of the low pass filter $G_{lpf}$. Thus, as the cutoff frequency of the low pass filter $G_{lpf}$, it is preferable to select such a frequency that can suppress the observation noise without attenuating the frequency band necessary for obtaining the battery characteristic. Specifically, the cutoff frequency of the low pass filter $G_{lpf}$ used by the low pass filter operator 3031 is preferably more than or equal to the cutoff frequency of a state variable filter used by the state variable filter operator 3032, more preferably equal to the cutoff frequency of the state variable filter. By this, it is possible to extract the frequency band necessary for obtaining the battery characteristic while sufficiently reducing the observation noise. As a result, the adaptive identification operator 3033 can enhance the identification accuracy in identifying the battery parameter φ^(k) of the battery model. In addition, this is likewise applicable to the method of carrying out the filter treatment by the low pass filter $G_{lpf}$ on the voltage estimated value V^(k) and voltage measured value V(k) which are each an equivalent transformation of FIG. 4 (refer to FIG. 7).

In addition, according to this embodiment, it is preferable that the low pass filter $G_{lpf}$ having the same characteristic be used for the filter treatment of the current measured value I(k), voltage measured value V(k) and voltage estimated value V^(k). This can eliminate a phase shift, thereby enhancing the identification accuracy of the battery parameter φ^(k) of the battery model.

Then, together with the conversion state quantity ω(k), the battery parameter φ^(k) of the secondary battery 10 thus calculated is sent out to the open circuit voltage estimator 304 from the battery parameter estimator 303, as shown in FIG. 2.

The open circuit voltage estimator 304 estimates the open circuit voltage of the secondary battery 10 based on the battery parameter φ^(k) and conversion state quantity ω(k) which are calculated by the battery parameter estimator 303, to thereby calculate the open circuit voltage estimated value V$_0$^(k). Hereinafter, the method of calculating the open circuit voltage estimated value V$_0$^(k) will be set forth.

That is, according to this embodiment, substituting into the expression (4) the battery parameter φ^(k) calculated by the above expression (13) and the conversion state quantity ω(k) calculated by the above expression (10) calculates the open circuit voltage estimated value V$_0$^(k).

Herein, the battery parameter φ^(k) corresponds to the parameters I$_i$, b$_{0i}$ which include the unknown parameters (T$_1$, T$_2$, K, h), as set forth above. Therefore, substituting into the expression (4) the battery parameter φ^(k) and conversion state quantity ω(k) which are calculated by the battery parameter estimator 303 can calculate the open circuit voltage estimated value V$_0$^(k). The open circuit voltage estimator 304 sends out the thus calculated open circuit voltage estimated value V$_0$^(k) to the SOC estimator 305.

Figure 8:
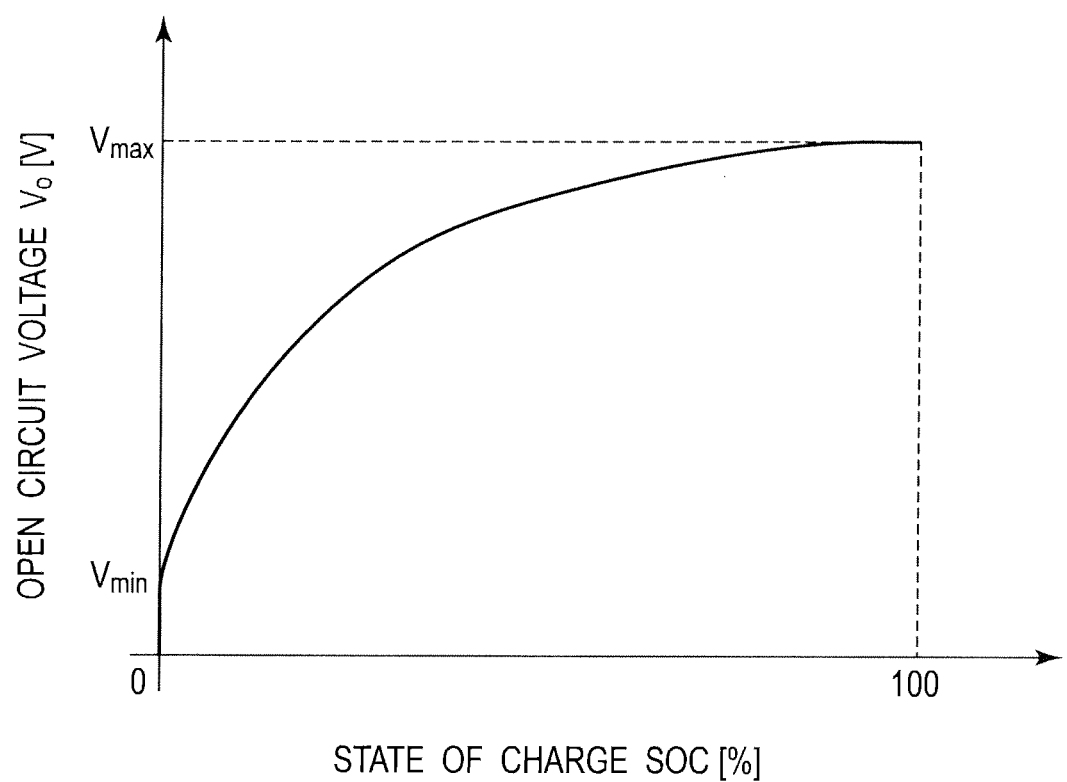
FIG. 8 is a drawing showing an example of an open circuit voltage relative to state of charge characteristic of the secondary battery.

From the open circuit voltage estimated value V$_0$^(k) calculated by the open circuit voltage estimator 304, the SOC estimator 305 calculates the state of charge estimated value SOC^(k) based on a predetermined open circuit voltage relative to state of charge characteristic of the secondary battery 10. In addition, FIG. 8 shows an example of the open circuit voltage relative to state of charge characteristic of the secondary battery 10. According to this embodiment, the open circuit voltage relative to state of charge characteristic of the secondary battery 10 is memorized in advance in the RAM provided in the electronic control unit 30. The open circuit voltage relative to state of charge characteristic of the secondary battery 10 can be calculated by obtaining the relation between the open circuit voltage and the state of charge through experiments and the like implemented for the secondary battery 10.

Figure 9:
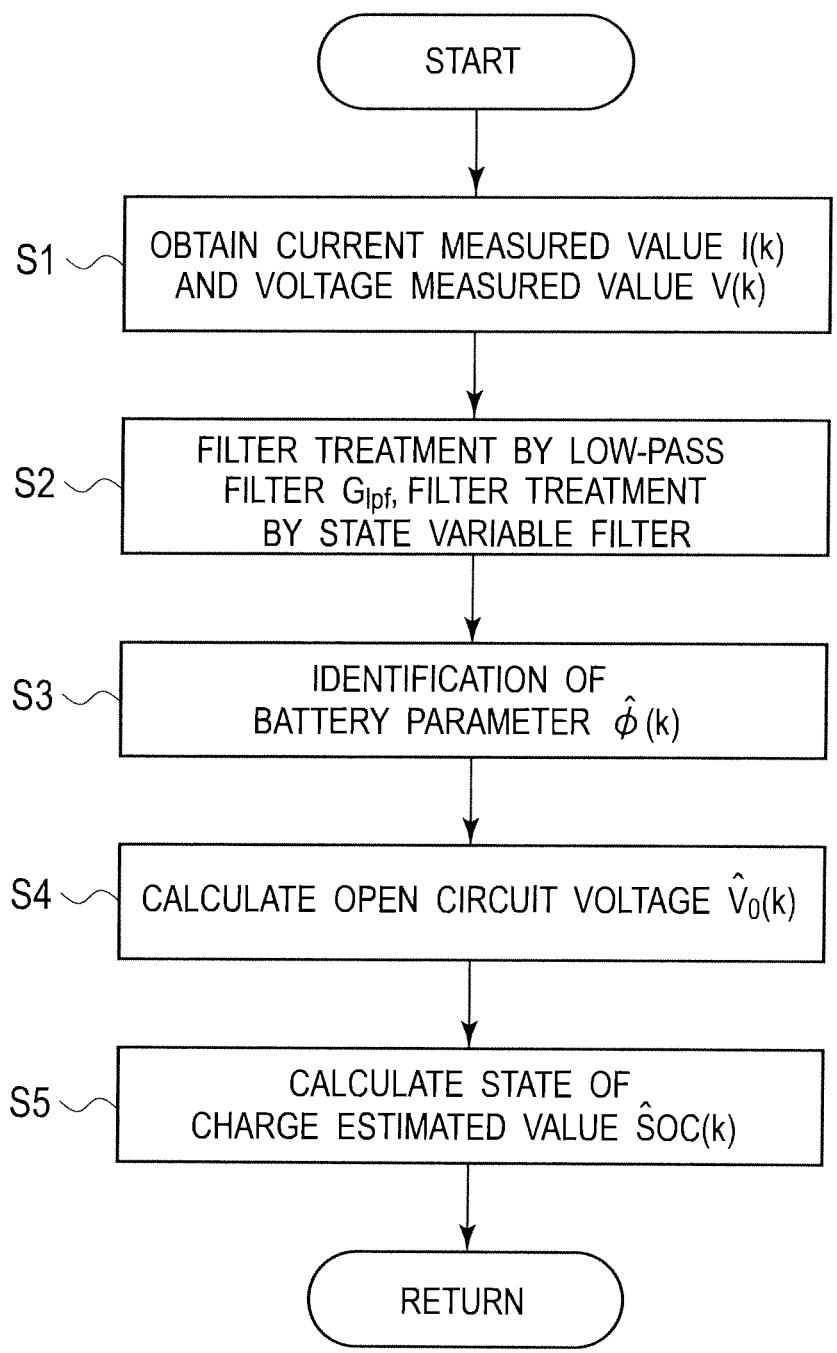
FIG. 9 is a flowchart showing estimation processings of the battery parameter and state of charge, according to the first embodiment.

Then, estimation processings of the battery parameter φ^(k) and state of charge estimated value SOC^(k) according to this embodiment will be set forth referring the flowchart shown in FIG. 9. Herein, the processings shown in FIG. 9 are to be implemented at a constant period, for example, every 100 msec. In the following explanation, I(k) denotes a current value of the present implementation period, that is, the present measured value, while I(k−1) denotes a current value of the previous implementation period (one time before), that is, a former measured value (one time before). Values other than the current value will be denoted likewise. In addition, the processings to be set forth below are implemented by the electronic control unit 30.

First, at step S1, the current detector 301 and voltage detector 302 respectively obtain the current measured value I(k) and voltage measured value V(k) respectively. The current measured value I(k) is sent out to the battery parameter estimator 303.

At step S2, the low pass filter operator 3031 of the battery parameter estimator 303 subjects the current measured value I(k) and voltage measured value V(k) to the filter treatment which uses the low pass filter $G_{lpf}$ to thereby remove the observation noise. Then, according to the above expressions (10) and (11), the state variable filter operator 3032 of the battery parameter estimator 303 subjects the current measured value I(k) and voltage measured value V(k) (with the observation noise removed) to the filter treatment which uses the state variable filter, to thereby calculate the conversion state quantity ω(k).

At step S3, by using the conversion state quantity ω(k) calculated at step S2 and the voltage measured value V(k) with the observation noise removed, the adaptive identification operator 3033 of the battery parameter estimator 303 implements the identification of the battery parameter $\hat{\phi}(k)$ of the battery model according to the above expression (13). Herein, the voltage estimated value $\hat{V}(k)$ used for implementing the identification of the battery parameter $\hat{\phi}(k)$ is the one that was subjected to the filter treatment which is implemented by the low pass filter operator 3031 and which uses the low pass filter $G_{lpf}$.

At step S4, according to the above expressions (4), (10) and (13), the open circuit voltage estimator 304 calculates the open circuit voltage estimated value $\hat{V}_0(k)$ based on the battery parameter $\hat{\phi}(k)$ and conversion state quantity ω(k) which are calculated by the battery parameter estimator 303. Then, the thus calculated open circuit voltage estimated value $\hat{V}_0(k)$ is sent out to the SOC estimator 305.

At step S5, by using the open circuit voltage estimated value $\hat{V}_0(k)$ calculated by the open circuit voltage estimator 304, the SOC estimator 305 calculates the state of charge estimated value $\widehat{SOC}(k)$ based on the predetermined open circuit voltage relative to state of charge characteristic of the secondary battery 10.

According to this embodiment, as set forth above, the battery parameter $\hat{\phi}(k)$ of the battery model of the secondary battery 10 and the state of charge estimated value $\widehat{SOC}(k)$ of the secondary battery 10 arc estimated.

Figure 10:
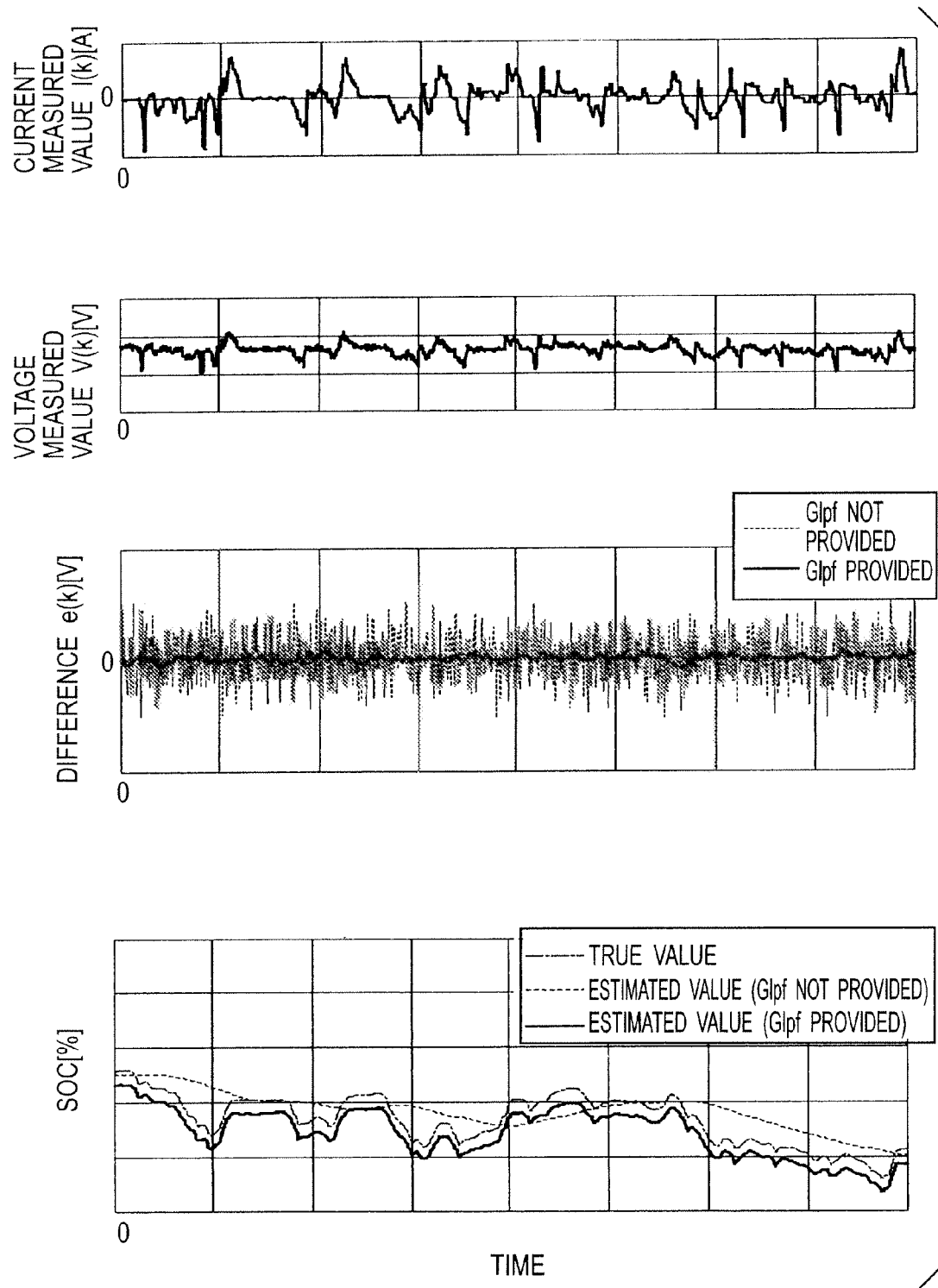
FIG. 10 is a drawing showing simulation results of the estimation processings of the state of charge, according to the first embodiment.

FIG. 10 shows results of verifying the effects of this embodiment by a simulation using the battery model. In FIG. 10, shown from the top are a profile showing the change of the current measured value I(k), a profile showing the change of the voltage measured value V(k), a profile showing the change of the difference $e(k)=V(k)-\hat{V}(k)$, and a profile showing the change of the estimated value of the state of charge SOC. Then, of these, with respect to the difference e(k) and the estimated value of the state of charge SOC, those simulated by using the current measured value I(k) and voltage measured value V(k) which were subjected to the filter treatment by the low pass filter $G_{lpf}$ are denoted by a solid line, while those simulated by using the current measured value I(k) and voltage measured value V(k) which were not subjected to the filter treatment by the low pass filter $G_{lpf}$ are denoted by a dotted line. Moreover, with respect to the estimated value of the state of charge SOC, a true value is denoted by a chain line in addition to the above estimated values.

As shown in FIG. 10, when the filter treatment was not implemented by the low pass filter $G_{lpf}$, the difference $e(k)=V(k)-\hat{V}(k)$ causes a large slur, as a result, the estimated value of the state of charge SOC is deviated from the true value. On the other hand, when the current measured value I(k) and voltage measured value V(k) were subjected to the filter treatment by the low pass filter $G_{lpf}$, the difference $e(k)=V(k)-\hat{V}(k)$ was converged to zero. It can be verified that this makes it possible to preferably estimate the battery parameter, as a result, making it possible to estimate the state of charge SOC with a high accuracy.

According to this embodiment, the voltage estimated value $\hat{V}(k)$ which is based on the battery model of the secondary battery 10 is calculated by using the current measured value I(k) and voltage measured value V(k). For removing the influence of a measurement noise included in the current measured value I(k) and voltage measured value V(k), the current measured value I(k) and voltage measured value V(k) are subjected to the filter treatment by the low pass filter $G_{lpf}$. Then, the current measured value I(k) and voltage measured value V(k) which were subjected to the filter treatment are used for estimating the battery parameter $\hat{\phi}(k)$ such that the difference e(k) between the voltage measured value V(k) and the voltage estimated value $\hat{V}(k)$ is converged to zero. By this operation, according to this embodiment, the influence of the measurement noise included in the current measured value I(k) and voltage measured value V(k) can be effectively removed, thus making it possible to easily converge the difference e(k) between the voltage measured value V(k) and the voltage estimated value $\hat{V}(k)$ to zero. By this, the identification accuracy of the battery parameter $\hat{\phi}(k)$ can be improved. Moreover, according to this embodiment, capability of identifying the battery parameter $\hat{\phi}(k)$ with a high accuracy can enhance the estimation accuracy of each of the open circuit voltage estimated value $\hat{V}_0(k)$ and the state of charge estimated value $\widehat{SOC}(k)$. In addition, this is likewise applicable to the method of carrying out the filter treatment by the low pass filter $G_{lpf}$ on the voltage estimated value $\hat{V}(k)$ and voltage measured value V(k) which are each an equivalent transformation of FIG. 4 (refer to FIG. 7).

Moreover, according to this embodiment, the cutoff frequency of the low pass filter $G_{lpf}$ is made more than or equal to the cutoff frequency of the state variable filter or made same as the cutoff frequency of the state variable filter. By this, the observation noise can be selectively reduced without attenuating the information necessary for obtaining the battery characteristic, specifically, the observation noise is selected from i) the information necessary for obtaining the battery characteristic included in the current measured value I(k) and voltage measured value V(k) and ii) the observation noise. Thus, the identification accuracy of the battery parameter $\hat{\phi}(k)$ can be further improved. Especially, it is so made that the cutoff frequency of the low pass filter $G_{lpf}$ is the same as the cutoff frequency of the state variable filter. By this, the observation noise can be suppressed to the minimum without attenuating the information necessary for obtaining the battery characteristic.

Second Embodiment

Next, an explanation will be made about a second embodiment of the present invention.

According to the second embodiment, as the low pass filter $G_{lpf}$ used for the filter treatment by the low pass filter operator 3031 and as the state variable filter used for the filter treatment by the state variable filter operator 3032, those not including a differentiator (differential operator) are used. Other structures are substantially the same as those according to the first embodiment.

Figure 11:
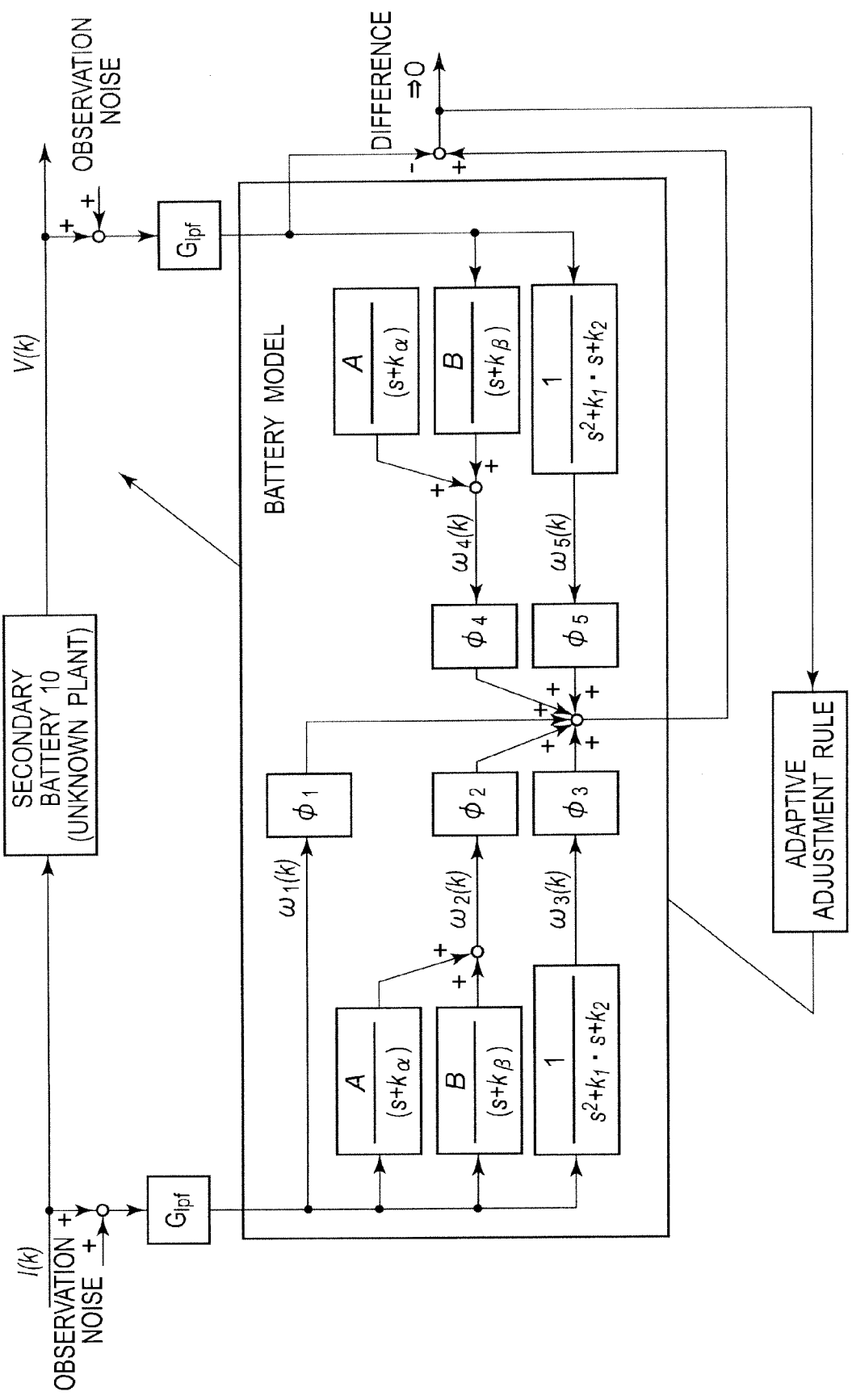
FIG. 11 is a block diagram of an adaptive identification system according to a second embodiment.

Referring to FIG. 11, the structure of an adaptive identification system according the second embodiment will be set forth. According to the second embodiment, as the low pass filter $G_{lpf}$, one that does not have the differentiator, that is, the differential operator s is used. Moreover, of the state variable filters used according to the first embodiment, one that has the differentiator, that is, $s/(s^2+k_1 \cdot s+k_2)$ is subjected to an application of a partial fractional breakdown, as shown by the following expression (15). By this, the state variable filter having the differentiator is rendered to be in a form that does not have the differentiator, that is, the differential operator s. By this, the adaptive identification system according to the second embodiment has the structure like that shown in FIG. 11.

[Expression 15]

$$\frac{s}{s^2 + k_1 \cdot s + k_2} = \frac{s}{(s+k_\alpha)(s+k_\beta)} = \frac{A}{(s+k_\alpha)} + \frac{B}{(s+k_\beta)} \quad (15)$$

According to the second embodiment, the following effects can be taken in addition to the effects of the first embodiment.

That is, according to the second embodiment, as the low pass filter $G_{lpf}$ used for the filter treatment by the low pass filter operator 3031 and the state variable filter used for the filter treatment by the state variable filter operator 3032, those not including the differentiator (differential operator s) are used. By this, even a short data length can make an accurate operation, thereby further reducing the influence by the observation noise. Thus, it is possible to further improve the estimation accuracy of the battery parameter of the battery model and the estimation accuracy of the state of charge SOC.

Especially, when a high-functional CPU having an FPU function cannot be used as a CPU of the electronic control unit 30 due to reduction of cost and power consumption, it is necessary to implement an operation with integer type variables. Then, when the low pass filter $G_{lpf}$ or state variable filter each having a differential characteristic is calculated by the integer type variables, it is necessary to coarsely set the resolution since the dynamic range of the variable is too small. Thus, in such a case, using the low pass filter $G_{lpf}$ or state variable filter each having the differentiator may cause an influence to the identification performance of the battery parameter $\hat{\phi}(k)$ even by a small observation noise or may cause an error to the estimated value of each of the battery parameter and the state of charge SOC. Contrary to this, according to the second embodiment, as the low pass filter $G_{lpf}$ and state variable filter, those not including the differentiator (differential operator s) are used. By this, even when the high-functional CPU having the FPU function cannot be used, the influence by the observation noise can be unlikely to be caused to the identification performance of the battery parameter $\hat{\phi}(k)$, thus making it possible to enhance the estimation accuracy of the battery parameter and the estimation accuracy of the state of charge SOC.

Figure 12:
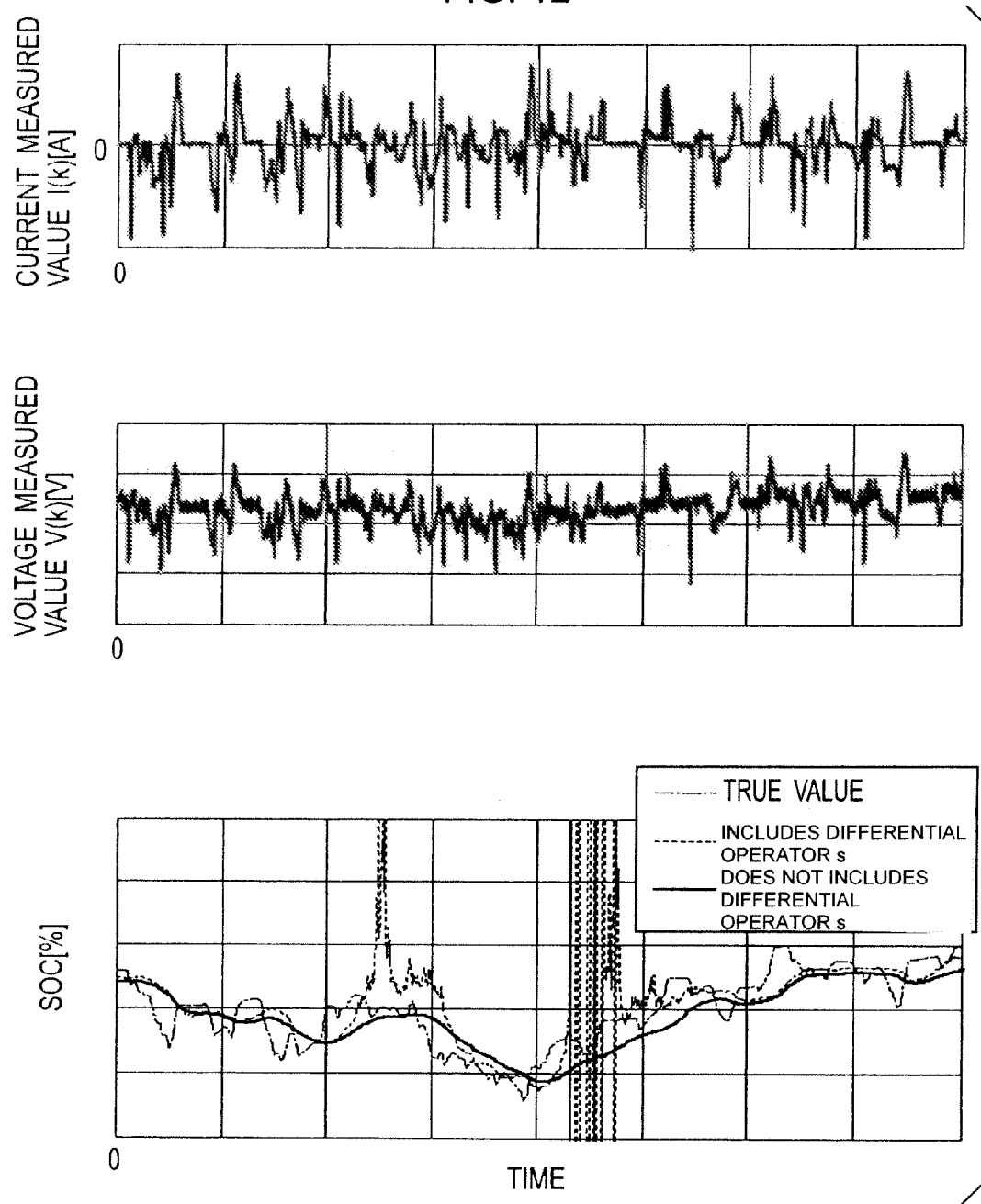
FIG. 12 is a drawing showing simulation results of the estimation processings of the state of charge, according to the second embodiment.

FIG. 12 shows results of verifying the effects of the second embodiment by a simulation using the battery model. In FIG. 12, shown from the top are a profile showing the change of the current measured value I(k), a profile showing the change of the voltage measured value V(k), and a profile showing the change of the estimated value of the state of charge SOC. Then, of these, with respect to the estimated value of the state of charge SOC, a solid line denotes a case where filters not including the differentiator (differential operator s) are used as the low pass filter $G_{lpf}$ and state variable filter while a dotted line denotes a case where filters including the differentiator (differential operator s) are used as the low pass filter $G_{lpf}$ and state variable filter. Moreover, with respect to the estimated value of the state of charge SOC, a true value is denoted by a chain line in addition to the above estimated values. In addition, FIG. 12 shows simulation results obtained when the operations related to the treatment by the low pass filter $G_{lpf}$ and state variable filter are of the integer type and the resolution is coarsely set.

As shown in FIG. 12, when the filter having the differentiator (differential operator s) is used as the low pass filter $G_{lpf}$ and state variable filter, the estimated value of the state of charge SOC spread in the mid-course of tests. Contrary to this, when the filter not having the differentiator (differential operator s) is used as the low pass filter $G_{lpf}$ and state variable filter, the battery parameter can be preferably estimated. As a result, it can be verified that the state of charge SOC can be estimated with a high accuracy.

Third Embodiment

Next, an explanation will be made about a third embodiment of the present invention.

According to the third embodiment, as the low pass filter $G_{lpf}$ used for the filter treatment by the low pass filter operator 3031 of the battery parameter estimator 303 and as the state variable filter used for the filter treatment by the state variable filter operator 3032 of the battery parameter estimator 303, primary filters are to be used respectively. Other structures are substantially the same as those according to the first embodiment.

That is, according to the third embodiment, as shown by the following expression (16), a partial fractional breakdown is applied to $s/(s^2+k_1 \cdot s+k_2)$ and $1/(s^2+k_1 \cdot s+k_2)$ which are each a state variable filter used according to the first embodiment.

[Expression 16]

$$\left.\begin{array}{l} \dfrac{s}{s^2 + k_1 \cdot s + k_2} = \dfrac{A}{(s+k_a)} + \dfrac{B}{(s+k_\beta)} \\ \dfrac{1}{s^2 + k_1 \cdot s + k_2} = \dfrac{C}{(s+k_a)} + \dfrac{D}{(s+k_b)} \end{array}\right\} \quad (16)$$

Figure 13:
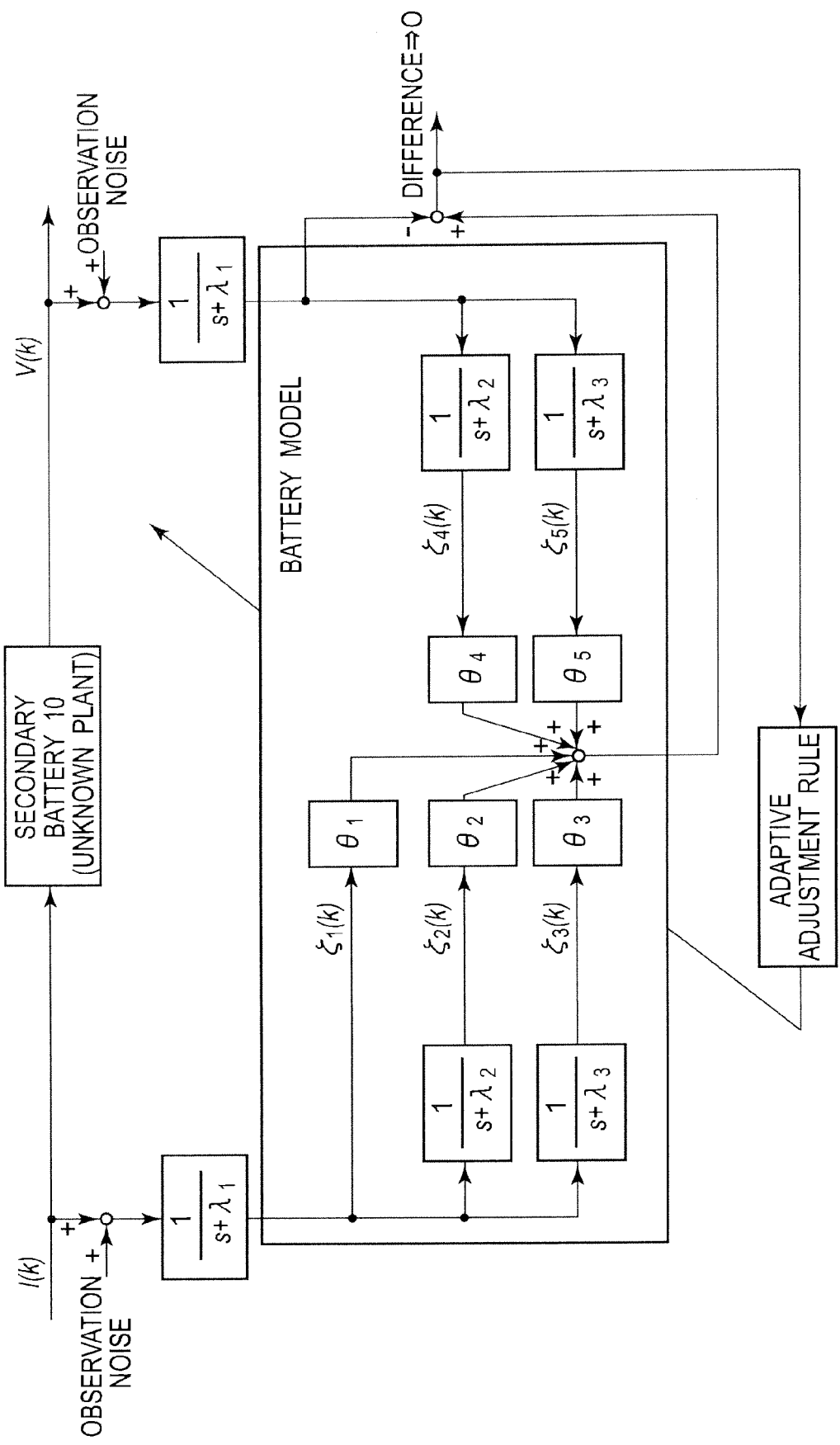
FIG. 13 is an example of a block diagram of an adaptive identification system, according to a third embodiment.

Then, in the above expression (16), with $k_a=k_\alpha$ and $k_b=k_\beta$, the common roots between the state variable filter and the low pass filter $G_{lpf}$ are bound up and put together, to thereby make a structure where the primary low pass filters are connected in parallel. Thus, the structure of the adaptive identification system can be the one shown in FIG. 13. In addition, with $k_1=2\cdot\sqrt{(k_2)}$, designing the low pass filter $G_{lpf}$ as to become a multiple root makes a structure where the primary low pass filters are connected in series. Thus, the structure of the adaptive identification system can be the one shown in FIG. 14. In addition, in FIGS. 13 and 14, $\zeta_1(k)$, $\zeta_2$, $\zeta_3(k)$, $\zeta_4(k)$ and $\zeta_5(k)$ are conversion state quantities while $\theta_1$, $\theta_2$, $\theta_3$, $\theta_4$ and $\theta_5$ are battery parameters of the battery model.

According to the third embodiment, the following effects can be taken in addition to the effects of the first embodiment.

That is, according to the third embodiment, the low pass filter operator 3031 and state variable filter operator 3032 implement the filter treatment by using the primary low pass filter as the low pass filter $G_{lpf}$ and state variable filter. Thus, the number of operations required for the filter treatment can be reduced. For example, in the adaptive identification system shown FIG. 4, the number of multiplications is eight and the number of additions-subtractions is four, while in the adaptive identification system shown in FIGS. 13 and 14, the number of multiplications is four and the number of additions-subtractions is two. With this, the operational load in the identification of the battery parameter can be reduced.

In addition, in the above embodiments, the current detector 301 corresponds to a current detecting means of the present invention, the voltage detector 302 corresponds to a voltage detecting means of the present invention, the low pass filter operator 3031 of the battery parameter estimator 303 corresponds to a low pass filter operating means of the present invention, the state variable filter operator 3032 of the battery parameter estimator 303 corresponds to a terminal voltage estimating means of the present invention, the adaptive identification operator 3033 of the battery parameter estimator 303 corresponds to an identifying means of the present invention, the open circuit voltage estimator 304 corresponds to an open circuit voltage estimating means of the present invention, and the SOC estimator 305 corresponds to a state of charge estimating means of the present invention.

As set forth above, although the embodiments of the present invention have been explained about, these embodiments are set forth for making it easy to understand the present invention, and therefore are not set forth for limiting the present invention. Thus, each element disclosed in the embodiments includes all design changes or equivalents that are included in the technical scope of the present invention.

INDUSTRIAL APPLICABILITY

By the battery state estimation device and battery state estimation method according to the present invention, the influence of the measurement noise included in the current measured value I(k) and voltage measured value V(k) can be effectively removed, thus making it easy to converge the difference e(k) between the voltage measured value V(k) and the voltage estimated value V^(k) to zero. By this, the identification accuracy of the battery parameter $\hat{\phi}(k)$ can be improved. In addition, capability of identifying the battery parameter $\hat{\phi}(k)$ with a high accuracy can enhance the estimation accuracy of each of the open circuit voltage estimated value $V_0\hat{}(k)$ and the state of charge estimated value SOC^(k). Thus, the battery state estimation device and battery state estimation method according to the present invention have an industrial applicability.

The entire contents of a Japanese Patent Application No. P2010-033903 with a filing date of Feb. 18, 2010 and a Japanese Patent Application No. P2011-026032 with a filing date of Feb. 9, 2011 are herein incorporated by reference.

The invention claimed is:

1. A battery state estimation device, comprising:
a current detector for detecting, as a current measured value, a current of a secondary battery;
a voltage detector for detecting, as a voltage measured value, a terminal voltage of the secondary battery;
a state variable filter operator which defines a battery model of the secondary battery, wherein by using a state variable filter which is based on the battery model, the state variable filter operator subjects to a state quantity conversion the current measured value and the voltage measured value to thereby calculate a conversion state quantity, and from the conversion state quantity, the state variable filter operator estimates, as a voltage estimated value, the terminal voltage of the secondary battery which terminal voltage is based on the battery model; and
an adaptive identification operator for identifying a parameter of the secondary battery such that a difference between the voltage measured value and the voltage estimated value is converged to zero,
wherein the adaptive identification operator subjects the voltage measured value and the voltage estimated value to a filter treatment by a low pass filter having a common high frequency breaking characteristic and calculates the difference by using the voltage measured value and the voltage estimated value which are subjected to the filter treatment by the low pass filter.

2. A battery state estimation device, comprising:
a current detector for detecting, as a current measured value, a current of a secondary battery;
a voltage detector for detecting, as a voltage measured value, a terminal voltage of the secondary battery;
a low pass filter operator for subjecting the current measured value and the voltage measured value to a filter treatment by a low pass filter having a common high frequency breaking characteristic;
a state variable filter operator which defines a battery model of the secondary battery, wherein by using a state variable filter which is based on the battery model, the state variable filter operator subjects to a state quantity conversion the current measured value and the voltage measured value which are subjected to the filter treatment by the low pass filter to thereby calculate a conversion state quantity, and from the conversion state quantity, the state variable filter operator estimates, as a voltage estimated value, the terminal voltage of the secondary battery which terminal voltage is based on the battery model; and
an adaptive identification operator for identifying a parameter of the secondary battery such that a difference between the voltage measured value subjected to the filter treatment by the low pass filter and the voltage estimated value is converged to zero.

3. The battery state estimation device according to claim 1 wherein a cutoff frequency of the low pass filter is more than or equal to a cutoff frequency of the state variable filter.

4. The battery state estimation device according to claim 3 wherein the cutoff frequency of the low pass filter is equal to the cutoff frequency of the state variable filter.

5. The battery state estimation device according to claim 1 wherein the low pass filter and the state variable filter are free from a differentiator.

6. The battery state estimation device according to claim 1 wherein the low pass filter and the state variable filter include only a serial connection or a parallel connection of a primary low pass filter.

7. A battery state estimation device, comprising:
a current detecting means for detecting, as a current measured value, a current of a secondary battery;
a voltage detecting means for detecting, as a voltage measured value, a terminal voltage of the secondary battery;
a terminal voltage estimating means which defines a battery model of the secondary battery, wherein by using a state variable filter which is based on the battery model, the terminal voltage estimating means subjects to a state quantity conversion the current measured value and the voltage measured value to thereby calculate a conversion state quantity, and from the conversion state quantity, the terminal voltage estimating means estimates, as a voltage estimated value, the terminal voltage of the secondary battery which terminal voltage is based on the battery model; and an identifying means for identifying a parameter of the secondary battery such that a difference between the voltage measured value and the voltage estimated value is converged to zero, wherein the identifying means subjects the voltage measured value and the voltage estimated value to a filter treatment by a low pass filter having a common high frequency breaking characteristic and calculates the difference by using the voltage measured value and the voltage estimated value which are subjected to the filter treatment by the low pass filter.

8. A battery state estimation device, comprising:

a current detecting means for detecting, as a current measured value, a current of a secondary battery;

a voltage detecting means for detecting, as a voltage measured value, a terminal voltage of the secondary battery;

a low pass filter operating means for subjecting the current measured value and the voltage measured value to a filter treatment by a low pass filter having a common high frequency breaking characteristic;

a terminal voltage estimating means which defines a battery model of the secondary battery, wherein by using a state variable filter which is based on the battery model, the terminal voltage estimating means subjects to a state quantity conversion the current measured value and the voltage measured value which are subjected to the filter treatment by the low pass filter to thereby calculate a conversion state quantity, and from the conversion state quantity, the terminal voltage estimating means estimates, as a voltage estimated value, the terminal voltage of the secondary battery which terminal voltage is based on the battery model; and an identifying means for identifying a parameter of the secondary battery such that a difference between the voltage measured value subjected to the filter treatment by the low pass filter and the voltage estimated value is converged to zero.

9. A battery state estimation method, comprising:

detecting, as a current measured value, a current of a secondary battery;

detecting, as a voltage measured value, a terminal voltage of the secondary battery;

defining a battery model of the secondary battery;

by using a state variable filter which is based on the battery model, subjecting to a state quantity conversion the current measured value and the voltage measured value to thereby calculate a conversion state quantity;

from the conversion state quantity, estimating, as a voltage estimated value, the terminal voltage of the secondary battery which terminal voltage is based on the battery model; and identifying a parameter of the secondary battery such that a difference between the voltage measured value and the voltage estimated value is converged to zero, wherein the identifying of the parameter of the secondary battery such that the difference between the voltage measured value and the voltage estimated value is converged to zero includes:

subjecting the voltage measured value and the voltage estimated value to a filter treatment by a low pass filter having a common high frequency breaking characteristic, and calculating the difference by using the voltage measured value and the voltage estimated value which are subjected to the filter treatment by the low pass filter.

10. A battery state estimation method, comprising:

detecting, as a current measured value, a current of a secondary battery;

detecting, as a voltage measured value, a terminal voltage of the secondary battery;

subjecting the current measured value and the voltage measured value to a filter treatment by a low pass filter having a common high frequency breaking characteristic;

defining a battery model of the secondary battery;

by using a state variable filter which is based on the battery model, subjecting to a state quantity conversion the current measured value and the voltage measured value which are subjected to the filter treatment by the low pass filter to thereby calculate a conversion state quantity;

from the conversion state quantity, estimating, as a voltage estimated value, the terminal voltage of the secondary battery which terminal voltage is based on the battery model; and identifying a parameter of the secondary battery such that a difference between the voltage measured value subjected to the filter treatment by the low pass filter and the voltage estimated value is converged to zero.

* * * * *